United States Patent
Park

(10) Patent No.: US 7,400,165 B2
(45) Date of Patent: Jul. 15, 2008

(54) METHOD FOR CALIBRATING A DRIVER AND ON-DIE TERMINATION OF A SYNCHRONOUS MEMORY DEVICE

(75) Inventor: Nak Kyu Park, Kyoungki-do (KR)

(73) Assignee: Hynix Semiconductor Inc., Kyoungki-do (KR)

(*) Notice: Subject to any disclaimer, the term of this patent is extended or adjusted under 35 U.S.C. 154(b) by 24 days.

(21) Appl. No.: 11/638,815

(22) Filed: Dec. 14, 2006

(65) Prior Publication Data
US 2007/0152704 A1 Jul. 5, 2007

(30) Foreign Application Priority Data
Dec. 15, 2005 (KR) .................. 10-2005-0124072

(51) Int. Cl.
*H03K 19/003* (2006.01)
(52) U.S. Cl. .............................. 326/30; 326/31
(58) Field of Classification Search ............... 326/30–34
See application file for complete search history.

(56) References Cited

U.S. PATENT DOCUMENTS

| 6,166,563 A * | 12/2000 | Volk et al. ............. 326/87 |
| 6,762,620 B2 * | 7/2004 | Jang et al. ............. 326/30 |
| 7,292,953 B2 * | 11/2007 | Jung ..................... 702/107 |

FOREIGN PATENT DOCUMENTS

KR 1020050012931 2/2005

* cited by examiner

*Primary Examiner*—James H Cho
(74) *Attorney, Agent, or Firm*—Ladas & Parry LLP

(57) ABSTRACT

An improved driver and ODT impedance calibration techniques of a synchronous memory device are provided. The impedance calibration is performed by generating a calibration enable signal showing a calibration operation mode entry. The code signals for an ODT calibration are generated for every predetermined interval of time. A first control signal is generated based on the calibration enable signal. A final code signal of the sequentially generated code signals is latched by the first control signal to use as a driver and ODT impedance calibration signal.

6 Claims, 16 Drawing Sheets

METHOD FOR CALIBRATING A DRIVER AND ON-DIE TERMINATION OF A SYNCHRONOUS MEMORY DEVICE

CROSS-REFERENCE TO RELATED APPLICATIONS

The present application claims priority to Korean patent application number 10-2005-0124072 filed on Dec. 15, 2005, which is incorporated herein by reference in its entirety.

BACKGROUND OF THE INVENTION

The present invention relates to an impedance calibration method of a driver and on-die termination (hereinafter referred to as "ODT") of a synchronous memory device, and more particularly, to an improved driver and ODT impedance calibration method of a synchronous memory device in which the calibration is normally made in an enable state to match a present impedance situation with a compensation for this.

In general, a semiconductor device such as a memory device exchanges data and the like with an external system. However, if the bus-line impedance used to connect a semiconductor device and an external system is different from the signal-line impedance of the semiconductor device directly connected to the bus line, it may cause a reflection of the data. In recent high-speed semiconductor devices, an impedance-matching device, such as an ODT device, is provided to prevent such a data reflection.

The ODT device includes resistance elements and is connected to an input/output line, which is connected to the input/output pad of the semiconductor device. The ODT device selectively turns on/off the resistance elements connected to the input/output line, thereby calibrating the impedance of the input/output line.

FIG. 1 is a circuit diagram showing an example of a device that calibrates the impedance of an ODT device.

In FIG. 1, an internal calibration enable signal (int_calen), a signal generated in the ODT impedance calibration mode, is generated inside the semiconductor device.

An external calibration enable signal (ext_calen) is a signal which is applied from outside during normal operation of the semiconductor device. The external calibration enable signal (ext_calen) is a signal to be applied in calibrating the ODT device impedance when a characteristic of the semiconductor device is changed due to the variation of temperature, voltage, and the like during normal operation.

In FIG. 1, an oscillator 110 receives an internal calibration enable signal (int_calen) at high level to output an oscillation signal (osc_clk). An M-bit counter 11 counts the pulse number of the oscillation signal (osc_clk).

A maximum counter trigger signal generator 120 is controlled by the M-bit counter 11, and, when the pulse of the oscillation signal (osc_clk) is M-th, the maximum counter trigger signal generator 120 transmits a trigger signal (int_discal) from low level to high level.

A pulse generator (130) is synchronized with the rising edge of the oscillation signal (osc_clk) to output a pulse signal (G_calp). Moreover, the pulse generator 130 receives the trigger signal (int_discal) and external calibration enable signal (ext_calen).

An oscillator 140 receives the pulse signal (G_calp) generated by the pulse generator 130, and controls the operation of the pulse generator 150. Here, a pulse signal (L_calp) outputted from the pulse generator 150 is synchronized with the rising edge of the pulse signal (G_calp) to produce a plurality of pulses.

An N-bit counter 12 counts the pulse number of the pulse generator 150.

A maximum counter trigger signal generator 160 is controlled by the N-bit counter 12, and the maximum counter trigger signal generator 160 disables the operation of the oscillator 140 when the pulse of the pulse signal (L_calp) is N-th.

The ODT impedance calibration portion 170 receives the output signal (L_calp) of the pulse generator 150 to output a plurality of control signals (code<0:n-1>). The ODT impedance is calibrated by the control signal (code<0:n-1>), which is selectively enabled (refer to reference numeral 220 of FIG. 2).

FIG. 2 is a more detailed view showing a portion of the circuit block illustrated in FIG. 1.

As illustrated in FIG. 2, the ODT impedance calibration device 170 includes a comparator 210, an ODT block 220, and an N-bit counter 230.

The comparator 210 and N-bit counter 230 are driven by the pulse signal (L_calp) outputted from the pulse generator 150.

The comparator 210 compares a line voltage (ZQ_in) applied to resistance (RQ) with a reference voltage (Vref).

The N-bit counter 230 receives an output signal (Com_out) of the comparator 210 to output a control signal (code<0:n-1>) which controls the ODT block 220.

The ODT block 220 calibrates the turn-on/turn-off of a PMOS transistor with the control signal (code<0:n-1>) to calibrate the impedance voltage of the ZQ line (ZQ_in). Reference characters A, B, C, and D within the ODT block 220 indicate resistance values.

The resistance (RQ) connected to the ZQ line (ZQ_in) is a reference resistance for calibration of the driver and ODT, which is a resistance targeted with respect to the calibration of P_Leg and L_Leg.

Hereinafter, referring to FIGS. 1 and 2, such a driver and ODT impedance calibration method will be described in more detail.

In general, if a semiconductor device wants to perform a normal operation, the driver and ODT impedance of the internal line, which receive the external signal or transmit the internal signal, should be calibrated to an optimum value. The driver and ODT impedance should be optimized in order to prevent the interference or distortion of the input signal.

An initial ODT impedance calibration in the semiconductor device is performed by the internal calibration enable signal (int_calen).

Then, it is necessary for the semiconductor device to recalibrate the driver and ODT impedance by reflecting the variation of temperature, voltage, and the like while performing a normal operation. In this case, the receipt of an external calibration enable signal (ext_calen) is used to recalibrate the impedance. Typically, however, the minimum period of an external calibration enable signal (ext_calen) is determined. This restricts the number of times available to recalibrate the impedance for a limited period of time.

FIG. 3A is another example of a conventional output driver and ODT impedance calibration circuit, in which the output signal (Pcode<0:5>, Ncode<0:5>) of the calibration circuit calibrates the resistance value of the impedance implemented by the memory device's output driver and ODT device.

The calibration circuit of FIG. 3A includes the calibration control signal generator 301, the P_Leg calibration portion 302, an N-Leg calibration portion 304, a final P_Leg 6-bit latch portion 303, and a final N_Leg 6-bit latch portion 305.

FIG. 3B illustrates an example of the input/output line receiving output signal (Pcode<0:5>, Ncode<0:5>) of FIG. 3A to calibrate the impedance of the line (L).

FIG. 4 is an example of the calibration control signal generator 301 illustrated in FIG. 3A, which includes a calibration enable portion 401, a maximum bit counter portion 402, and a calibration oscillation portion 403.

FIG. 5 is an example of the P_Leg calibration portion 302 illustrated in FIG. 3A, which includes an output driver & ODT P_Leg 501, a 2-stage comparator amplifier 502, and an up-down bit counter portion 503.

FIG. 6 is an example of the N_Leg calibration portion 304 illustrated in FIG. 3A, which includes an output driver and ODT N_Leg 601, a 2-stage comparator amplifier 602, and an up-down bit counter portion 603.

FIG. 7 is an illustration explaining the operation of the circuit illustrated in FIGS. 3A-3B and 4 through 6.

As illustrated above, the calibration control signal generator 301 generates enable signals (Cal_en, Cen__1st, Cen__2nd) in response to the pulse signal (Cal_enp). In other words, as seen in FIGS. 4 and 7, the enable signal (Cal_en) is enabled to high level by the pulse signal (Cal_enp). While the enable signal (Cal_en) is enabled, the calibration oscillator 403 generates the enable signals (Cen__1st, Cen__2nd) having waveforms as shown in FIG. 7. The maximum bit counter portion 402 of FIG. 4 counts a toggling number of the enable signal (Cen__2nd) to output a stop signal (STOP) when the toggling number of the enable signal (Cen__2nd) is matched with the maximum counter set in the maximum bit counter portion 402. The enable signal (Cal_en) of the calibration enable portion 401 is disabled to low level by the stop signal (STOP).

Next, FIG. 5 is an example of the P_Leg calibration portion 302 illustrated in FIG. 3A. In FIG. 5, ZQ is connected to the output driver & ODT P_Leg 501 which is a PMOS impedance portion used as an ODT of external resistances (RQ in FIG. 2), data pull-up output drivers, data, address, and command. A voltage level of the ZQ node and a reference voltage (vrefd) at a predetermined level are compared in the 2-stage comparator amplifier 502. When the voltage level of the ZQ node is lower than that of the reference voltage (vrefd), an output signal (up_dnz) of the 2-stage comparator amplifier 502 becomes high level. When the output signal (up_dnz) becomes high level, an output signal value (Pcode_pre<0:5>) of the up-down bit counter portion 503 increases by one step to reduce an impedance of the output driver and ODT impedance.

FIG. 6 is an example of an N-Leg calibration portion 304 illustrated in FIG. 3a.

In FIG. 6, an output driver & ODT N_Leg 601 is connected to an output of the P_Leg calibration portion 302 of FIG. 5 and a pull-down N-Leg of the driver, which is provided to calibrate the pull-down N_Leg of the driver according to a level of the output driver & ODT P_Leg 501 of FIG. 5. The N-Leg calibration portion 304 of FIG. 6 outputs an internal voltage Vint while calibrating a count value of the signal Nnode_pre<0:5> to compare with a reference voltage Vrefd, and the 2-stage comparator amplifier 602 compares the reference voltage Vrefd with the internal voltage Vint, and the up-down bit counter portion 603 increases or decreases a value of the signal Nnode_pre<0:5> by one step according to a logic level of an output signal (up_dnz) of the 2-stage comparator amplifier 602.

The above-mentioned process is performed until the increase/decrease of the signal (Pcode_pre<0:5>, Ncode_pre<0:5>) is repeated with the same value (for example, 011100->111100->011100, ->111100, . . . ).

Shown in FIG. 7 is a case where an internal calibration operation is performed three times and a value of the signal (Pcode_pre<0:5>) is increased by one step according to each calibration.

In FIG. 7, when the calibration is terminated by a first pulse signal (Cal_enp), a value of the signal (Pcode_pre<0:5>) is "011100." However, in the prior art, the value "011100" of the calibrated signal (Pcode_pre<0:5>) is reflected in the output driver and ODT device when a second pulse signal (Cal_enp) is applied. In other words, as seen in FIG. 3, the signal (Pcode_pre<0:5>) having the value "011100" is outputted from the final P_Leg 6-bit latch portion 303 in response to the second pulse signal (Cal_enp). Accordingly, the final P_Leg 6-bit latch portion 303 outputs the signal Pcode<0:5> having the value "011100."

As a result, there is a problem that the variation of temperature, voltage, and the like corresponding to a present calibration period cannot be reflected in the present calibration but reflected in the next calibration.

On the other hand, FIG. 8 is an illustration for explaining input signal waveforms of a 2-stage comparative amplifier of FIG. 5 and its resulting output signal (Pcode_pre<0:5>) values of the up-down bit counter portion 503. For a reference, an example of the 2-stage comparator amplifier 502 is illustrated in FIG. 15.

As seen in FIG. 8, when a level difference between signals (d0, d0z) is greater than a predetermined level, the comparison time is short and the amplification degree is good as illustrated in ① or ② in FIG. 8, but when a level difference between the input signals is very small as illustrated in ③, it takes a longer time until the next stage amplifies the level to the extent that it can be recognized as a low or high level. When a value is latched in such an unstable region ③, the signal (Pcode_pre<0:5>) may not be increased (Case-1) or decreased (Case-2) by one step; or it may occur a case where a totally different value ends up being latched (Case-3). In such a case, there is a problem that an impedance level of the output driver and an impedance level of the ODT device may get out of an optimal tolerance range.

SUMMARY OF THE INVENTION

In order to solve the above-mentioned and other problems, the present invention provides a calibration method in which the increase/decrease of an output driver impedance and an ODT device impedance is stabilized by controlling a control signal for impedance calibration by one step at every level, such that the calibration is reflected in the relevant region according to the variation of temperature and voltage.

Further, the present invention provides a minimum and maximum stop (Min & Max STOP) portion such that the internal calibration is stopped when a calibration impedance has the maximum or minimum value, and the calibration is stopped at a final value when ZQ pins are respectively not connected but floated to test many devices at a time such as TDBI (test during burn-in), thereby receiving normal input by a receiver without an ODT application, in order to perform a normal test.

According to a first embodiment of the present invention, there is provided a driver and ODT calibration method of a synchronous memory device, comprising the steps of (a) generating a calibration enable signal for a calibration operation mode entry; (b) sequentially generating code signals for calibrating the ODT for every predetermined interval of time; (c) producing a first control signal generated based on the calibration enable signal; and (d) latching a final code signal of the sequentially generated code signals by the first control signal to use as a driver and ODT impedance calibration signal.

In the first embodiment of the present invention, each of the code signals generated sequentially in the step (b) is increased by one step or decreased by one step, and the one step indicates one bit.

According to a second embodiment of the present invention, there is provided a driver and ODT impedance calibration method of a synchronous memory device, comprising the steps of (a) generating an calibration enable signal (Cal_enp) for starting a calibration operation; (b) producing a first through a third calibration control signals (CPcal, CNcal, update) in response to the calibration enable signal; (c) outputting a first preliminary signal (Pcode_pre<0:5>) to calibrate a pull-up impedance of an output driver and ODT of the memory device in response to the first calibration control signal (CPcal), and outputting a second preliminary signal (Ncode_pre<0:5>) to calibrate a pull-down impedance of the output driver of the memory device in response to the second calibration control signal (CNcal); and (d) applying the first and the second preliminary signals to a pull-up and pull-down impedance calibration portion of the output driver and ODT in response to the third signal (update).

In the second embodiment of the present invention, the method includes a step of comparing a reference voltage with a voltage level of an output node ZQ of the driver and ODT circuit pull-up, and includes a step of comparing a reference voltage with a node (Vint) voltage level where a driver pull-down output is connected to a driver and ODT pull-up output.

DESCRIPTION OF SPECIFIC EMBODIMENTS

Hereinafter, the present invention will be described in detail with reference to the accompanying drawings.

Figure 9:
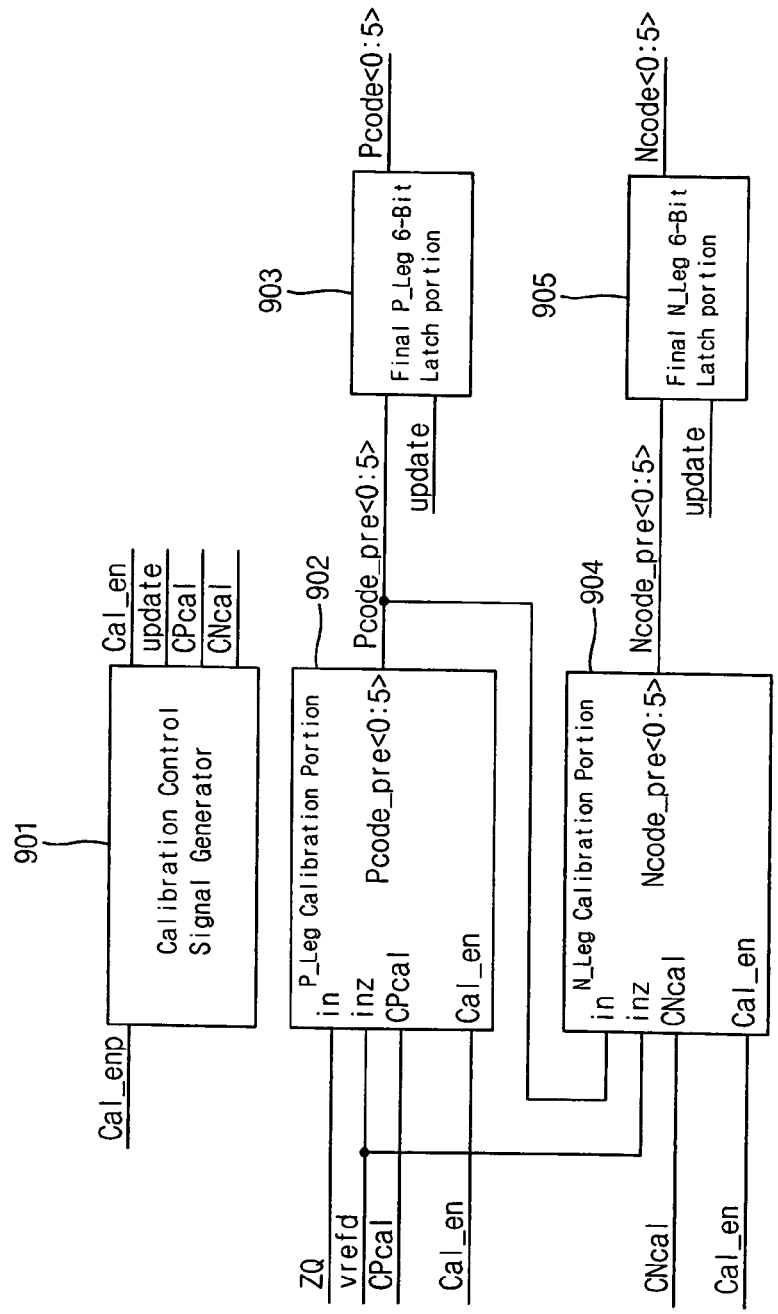
FIG. 9 is a circuit diagram showing an output driver and ODT impedance calibration circuit according to an embodiment of the present invention.

FIG. 9 is an example of an impedance calibration circuit of an output driver and ODT device according to an embodiment of the present invention, according to which the output signals (Pcode<0:5>, Ncode<0:5>) of the impedance calibration circuit calibrate a resistance value of the impedance implemented in the output driver and ODT device of a memory device.

The calibration circuit of FIG. 9 includes a calibration control signal generator 901, a P_Leg calibration portion 902, an N_Leg calibration portion 904, a final P-Leg 6-bit latch portion 903, and a final N_Leg 6-bit latch portion 905.

Figure 10:
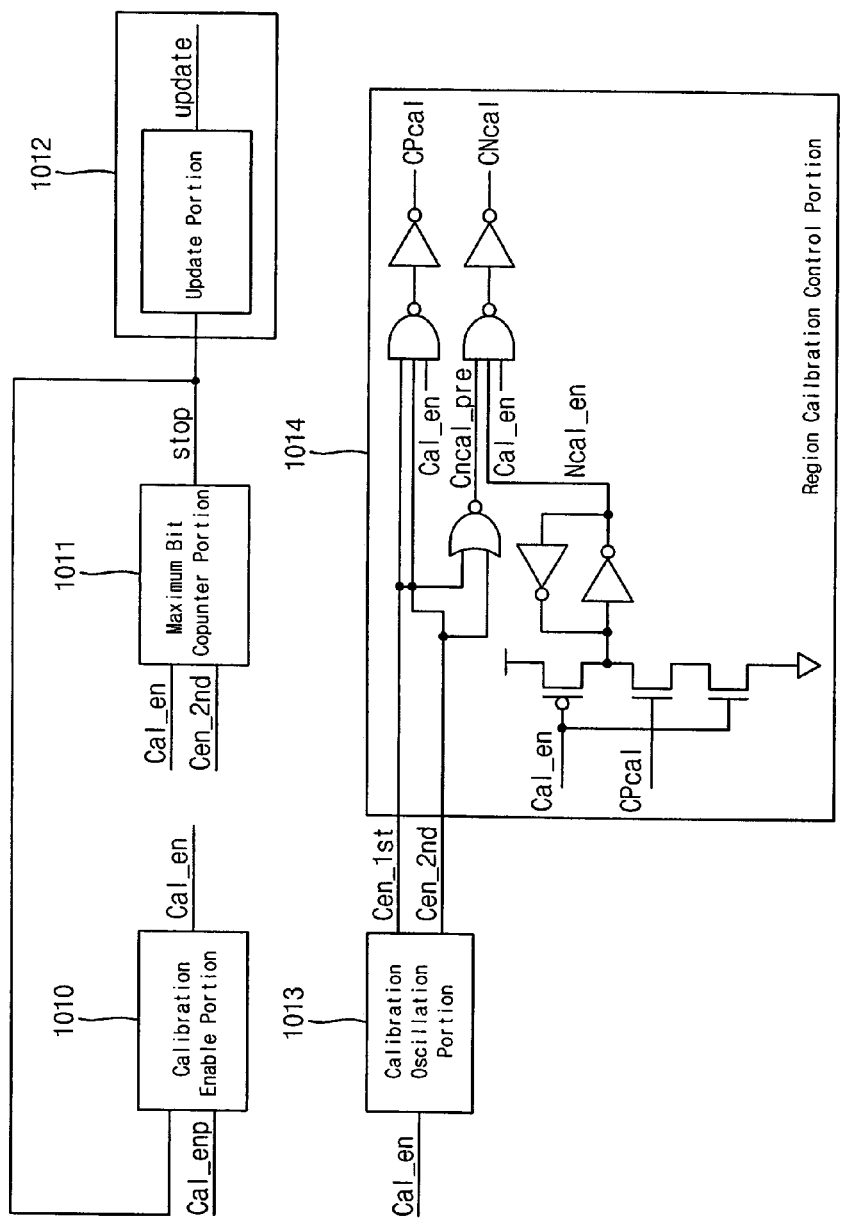
FIG. 10 is a circuit diagram showing an example of the calibration control signal generating portion of FIG. 9.

The calibration control signal generator 901 produces signals (Cal_en, update, CPcal, CNcal) in response to a calibration enable pulse signal (Cal_enp). A specific example of the calibration control signal generator 901 is illustrated in FIG. 10

Figure 11:
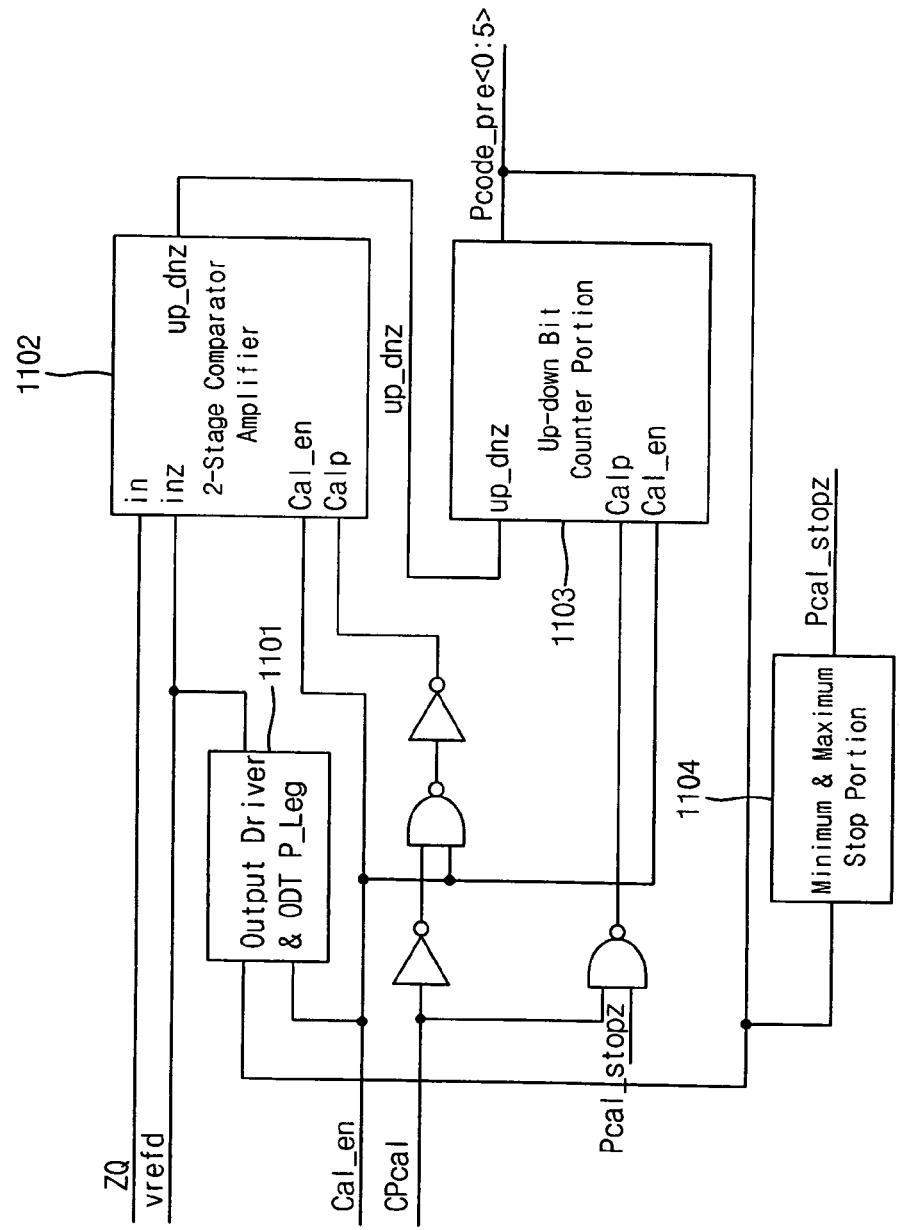
FIG. 11 is an example of the P-Leg calibration portion of FIG. 9.

The P_Leg calibration portion 902 compares a ZQ node voltage with a reference voltage (vrefd) to produce a signal (Pcode_pre<0:5>) for controlling an impedance of the output driver and ODT device. An example of the P_Leg calibration portion 902 is illustrated in FIG. 11.

N_Leg calibration portion 904 compares the output signal (Pcode_pre<0:5>) of the P_Leg calibration portion 902 (which is regarded as the driver/ODT pull-up portion) with a reference voltage (vrefd) to output the signal (Ncode_pre<0:5>), which is regarded as the driver/ODT pull-down portion.

The final P_Leg 6-bit latch portion 903 outputs a final signal (Pcode<0:5>) by calibrating the (Pcode_pre<0:5>) signal in response to an update signal (update). The final signal (Pcode<0:5>) is a signal for calibrating an impedance of the output driver and ODT device. Typically, the final signal (Pcode<0:5>) is not applied to a driver and ODT pull-up of the calibration portion for calibration, but the final signal (Pcode<0:5>) is applied to a driver and ODT pull-up of the DQ portion positioned at a pad portion, and an ODT pull-up of the address and command.

The final N_Leg 6-bit latch portion 905 receives a signal (Ncode_pre<0:5>) and calibrates the received signal in response to an update signal (update) to output a final signal (Ncode<0:5>). The final signal (Ncode<0:5>) is a signal which calibrates an impedance of the output driver, and typically the final signal (Ncode<0:5>) is not applied to a driver pull-down of the calibration portion for calibration, but the final signal (Ncode<0:5>) is applied to a pull-down of the DQ portion positioned at a pad portion.

FIG. 10 is an example of the calibration control signal generating portion of FIG. 9, which includes a calibration enable portion 1010, a maximum bit counter portion 1011, an update portion 1012, a calibration oscillator 1013, and a region calibration controller 1014.

In FIG. 10, the calibration enable portion 1010 receives a calibration enable pulse signal (Cal_enp) to output a calibration enable signal (Cal_en).

The calibration oscillator 1013 outputs a first and a second calibration enable pulse signals (Cen_1st, Cen_2nd) in response to the calibration enable signal (Cal_en).

The maximum bit counter portion 1011 is a circuit counting a toggling number of the second calibration enable pulse signal (Cen_2nd) while the calibration enable signal (Cal_en) is enabled. As a result of the counting, when it is same as a maximum counter number set in the maximum bit counter portion 1011, a stop signal (stop) for stopping the calibration operation is outputted and applied to the calibration enable portion 1010. When a stop signal (stop) is received, the operation of the calibration enable portion 1010 is stopped.

The update portion 1012 outputs an update signal (update) in response to the stop signal (stop), and the signal (Pcode<0:5>) is recalibrated in response to the update signal (update).

The region calibration controller 1014 receives the first and the second calibration enable pulse signals (Cen__1st, Cen__2nd) to output a first and a second calibration signals (CPcal, CNcal).

Figure 14:
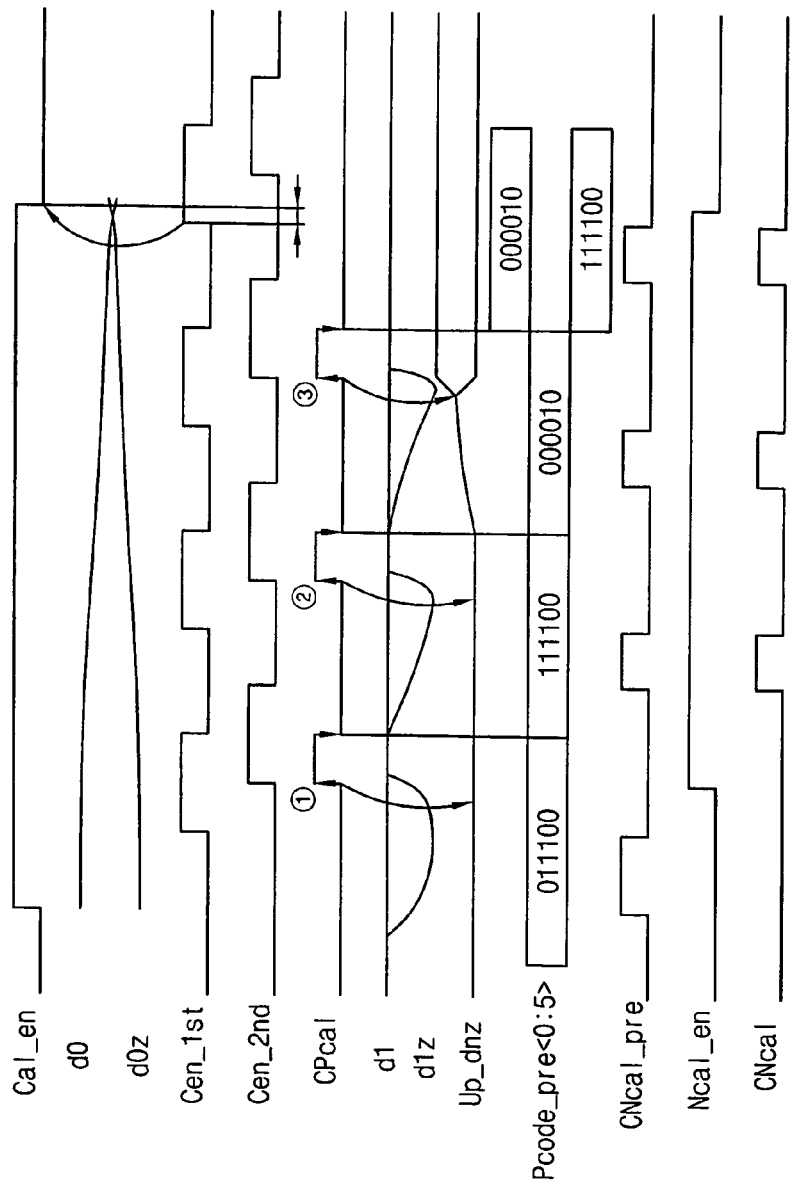
FIG. 14 is a waveform diagram for explaining the operation of FIG. 11.

As illustrated in FIG. 14, a rising edge of the first calibration signal (CPcal) is synchronized with a rising edge of the second calibration enable pulse signal (Cen__2nd), and a falling edge of the first calibration signal (CPcal) is synchronized with a falling edge of the first calibration enable pulse signal (Cen__1st). Furthermore, a rising edge of the second calibration signal (CNcal) is synchronized with a falling edge of the second calibration enable pulse signal (Cen__2nd), and a falling edge of the second calibration signal (CNcal) is synchronized with a rising edge of the first calibration enable pulse signal (Cen__1st).

In FIG. 10, an output signal (CPcal) of the region calibration controller 1014 is a signal calibrating a pull-up impedance of the output driver and an impedance of the ODT device. An output signal (CNcal) is a signal calibrating a pull-down impedance of the output driver.

FIG. 11 is an example of the P_leg calibration portion 902 illustrated in FIG. 9, which includes an output driver & ODT P_Leg portion 1101, a 2-stage comparator amplifier 1102, a up-down bit counter portion 1103, and a minimum & maximum stop portion 1104.

The output driver & ODT P_Leg 1101 is a pull-up portion having a driver pull-up of the DQ portion, and a reference impedance being used as an ODT of the DQ, address, and command, and the pull-up impedance is adjusted according to an impedance of the ZQ portion. The driver pull-up of the DQ portion and the ODT portion of the DQ, address, and command includes a number of reference pull-up portions to implement the corresponding impedance. For example, if ZQ is 240 ohm, the output driver and ODT P_Leg 1101 of the calibration portion becomes an impedance element having 240 ohm by calibration. If 120 ohm is required for an ODT impedance of the DQ portion, two elements are turned on from a number of pull-up elements being configured identically as the output driver and ODT P_Leg 1101 of the calibration portion, thereby implementing an ODT having 120 ohm. In other words, the output driver and ODT P_Leg 1101 of the calibration portion is configured with the same element being used as a pull-up driver and ODT of the DQ portion, and an ODT of the address and command. The output driver and ODT P_Leg 1101 of the calibration portion represents the above configuration, being merely an element by which the output driver and ODT P_Leg 1101 becomes the same level as the ZQ impedance while changing the value which is periodically turned on by a signal Pcode_pre<0:5>according to a resistance of the ZQ.

When the impedance is determined by Pcode_pre<0:5>, it will be sent to the DQ portion and the same element of the address and command. At this time, the actually sent value is not an in-between value during the calibration, but a final value Pcode<0:5> for which the calibration has been performed three times.

The 2-stage comparator amplifier 1102 senses a level difference between the input signals, and the up-down bit counter portion 1103 increases or decreases the signal (Pcode_pre<0:5>) by one step in response to an output signal (up_dnz) of the 2-stage comparator amplifier 1102.

The minimum & maximum stop portion 1104 outputs a signal (Pcal_stopz) for disabling an operation of the up-down bit counter portion 1103 when the signal (Pcode_pre<0:5>) is "000000" or "111111". In general, when the signal (Pcode_pre<0:5>) is "000000" or "111111", it will be a case when an external resistance is not connected to the ZQ terminal. Typically, when an external resistance is not connected to the ZQ terminal, an increase or decrease of the signal (Pcode_pre<0:5>) value can be continuously repeated, and therefore an effect of preventing this repetitive operation in advance can be obtained by providing the minimum & maximum stop portion 1104 according to an embodiment of the present invention.

Figure 12:
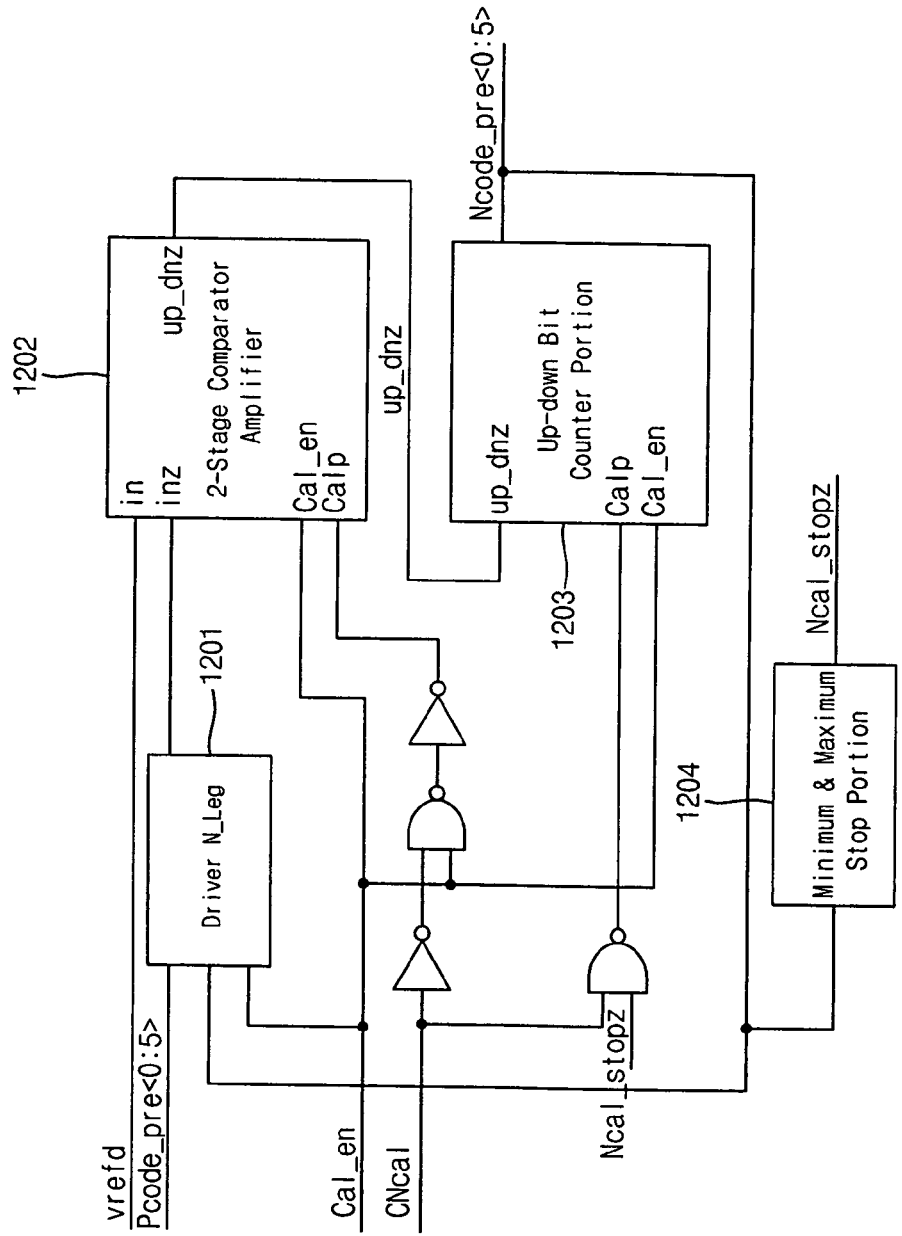
FIG. 12 is an example of the N-Leg calibration portion of FIG. 9.

FIG. 12 is an example of the N_leg calibration portion 904 as shown in FIG. 9, which includes an output driver N_Leg 1201, and a 2-stage comparator amplifier 1202, an up-down bit counter portion 1203, and a minimum & maximum stop portion 1204.

The output driver N_Leg 1201 is connected to an output of the output driver and ODT P_Leg 1101 being calibrated by Pcode_pre<0:5>. The output driver N_Leg 1201 is also an element being used as a reference of a pull-down portion in the DQ portion. If the output driver and ODT P_Leg 1101 being calibrated by Pcode_pre<0:5>has 240 ohm, the output driver N_Leg 1201 also has 240 ohm. As the output driver and ODT P_Leg 1101 has been described above, if the strength of a pull-down driver in the DQ portion wants to implement 60 ohm by turning on four among a number of pull-down elements being configured identically as the output driver N_Leg portion 1201 of the calibration portion, thereby applying 60 ohm for the pull-down driver. In other words, the output driver N_Leg portion 1201 of the calibration portion can be configured with the same element used as a pull-down of the DQ portion.

In other words, the output driver N_Leg 1201 of the calibration portion is an element by which the output driver N_Leg 1201 becomes the same level as the impedance of the output driver and ODT P_Leg 1101 while changing the value being periodically turned on by Ncode_pre<0:5> according to a resistance of the output driver and ODT P_Leg 1101.

When the impedance is determined by Ncode_pre<0:5>, it will be sent to the same device of a pull-down in the DQ portion. In this case, the value sent is not an in-between value during the calibration, but a final value Ncode<0:5> for which the calibration has been performed three times.

The functions and operations of the 2-stage comparator amplifier 1202, the up-down bit counter portion 1203, and the minimum & maximum stop portion 1204 are same as those 1102 and 1103 shown in FIG. 11.

Figure 13:
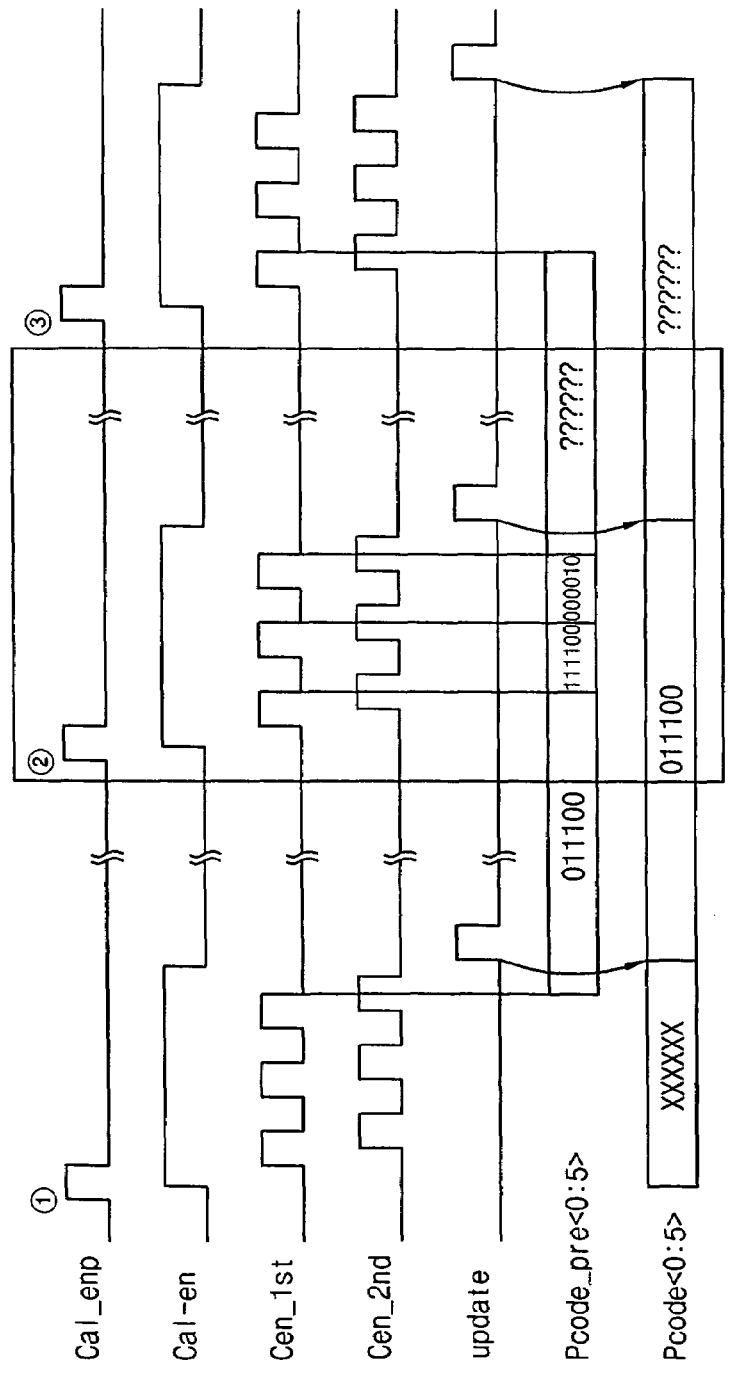
FIG. 13 is a waveform diagram for explaining the operation of FIGS. 9 through 12.

FIG. 13 is a waveform diagram for explaining the operations of the circuit illustrated in FIGS. 9 through 12.

As seen in FIG. 13, the enable signal (Cal_en) is enabled to a high level by the pulse signal (Cal_enp). While the enable signal (Cal_en) is enabled, first and second calibration enable signals (Cen__1st, Cen__2nd) are generated by calibration oscillator 1013.

When a toggling number of the second calibration enable signal (Cen__2nd), which is a pulse signal, is same as the number of the maximum bit set up in the maximum bit counter part 1011, the update portion 1012 outputs an update signal (update). If the update signal is enabled, the present signal (Pcode<0:5>) is replaced with the signal (Pcode_pre<0:5>) by final P_Leg 6-bit latch portion 903, which is illustrated in FIG. 9.

In FIG. 13, it is illustrated a case when a value of the signal (Pcode_pre<0:5>) is calibrated by a calibration operation in the increased direction of 011100->111100->000010 by one step. For the signal (Pcode<0:5>), it is seen that when the update signal is enabled, a final value of the signal (Pcode_pre<0:5>) is replaced with the signal (Pcode<0:5>).

Figure 15:
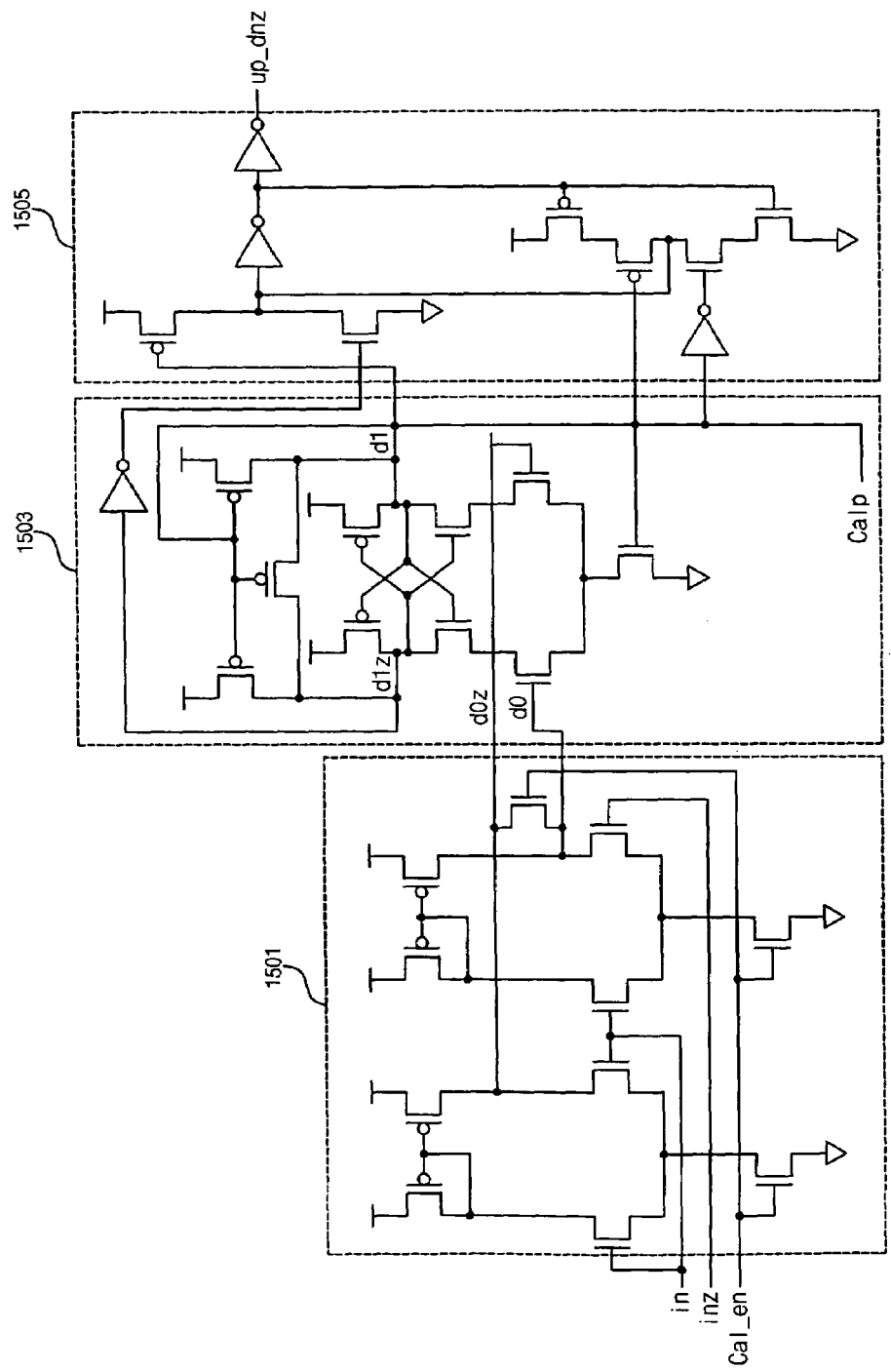
FIG. 15 is a circuit diagram showing an example of the 2-stage comparator amplifier of FIGS. 11 and 12.

FIG. 14 is a waveform diagram for explaining in more detail an operation of a circuit block illustrated in FIG. 11, and FIG. 15 is a circuit diagram showing an example of a 2-stage comparator amplifier used in FIGS. 11 and 12.

As described above, the calibration operation is performed while the calibration enable signal (Cal_en) is high level. In FIG. 11, the 2-stage comparator amplifier 1102 amplifies input signals being applied to the input terminals (in, inz) to produce first amplified signals (d0z, d0). Then, the first amplified signals (d0z, d0) are amplified again to produce second amplified signals (d1z, d1). As seen in FIG. 15, a logic level of the output signal (up_dnz) is determined by the second amplified signals (d1z, d1).

As seen in FIG. 14, when a voltage difference between the first amplified signals (d0z, d0) is large, a voltage difference between the second amplified signals (d1z, d1) is also large. Therefore, the output signal (up_dnz) of the 2-stage comparator amplifier illustrated in FIG. 11 has a stabilized logic level. In other words, as shown in the points ① and ② of FIG. 14, when the amplified signal (d1z) is low level at a rising edge timing of the signal (CPcal), which has been obtained by performing an AND operation for the signal (Cen__1st) and the signal (Cen__2nd), the output signal (up_dnz) is low level.

However, as shown in the point ③ of FIG. 14, when the voltage difference between the first amplified signals (d0z, d0) is small, the voltage difference between the second amplified signals (d1z, d1) is also small. In this case, occasionally, the output signal (up_dnz) can have a mid-level value as illustrated in FIG. 14.

Figure 1:
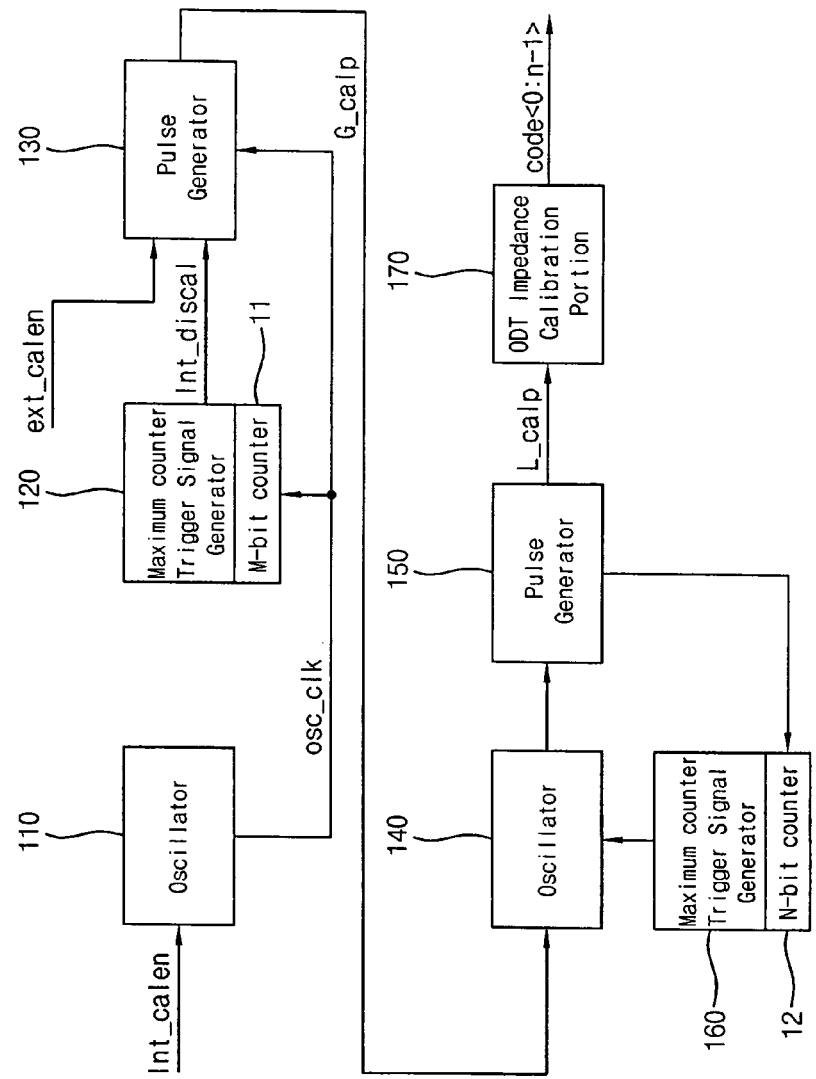
FIG. 1 is a circuit diagram showing an example of an impedance calibration device of a conventional ODT device.
Figure 2:
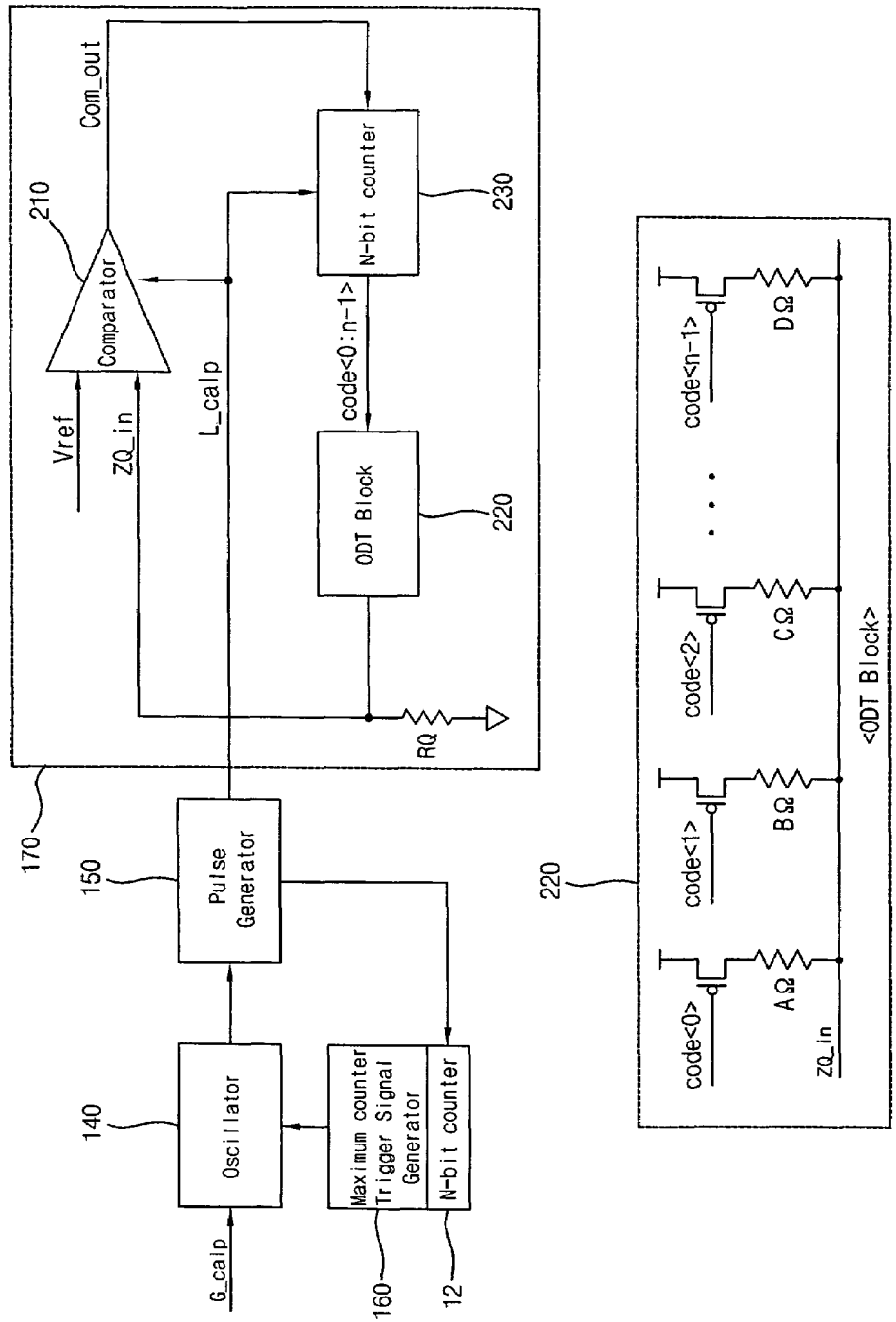
FIG. 2 is a detailed circuit diagram of FIG. 1.
Figure 3A:
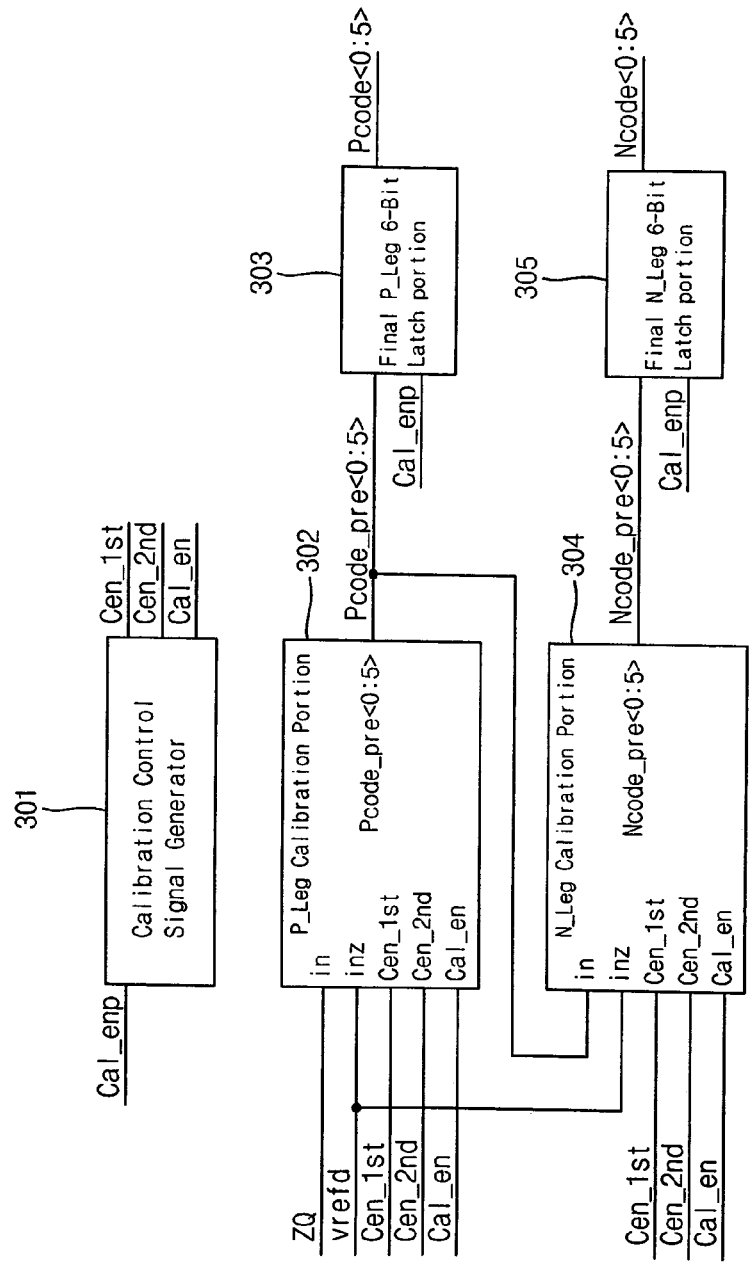
FIG. 3A is a circuit diagram showing another example of a conventional output driver and ODT impedance calibration circuit.
Figure 3B:
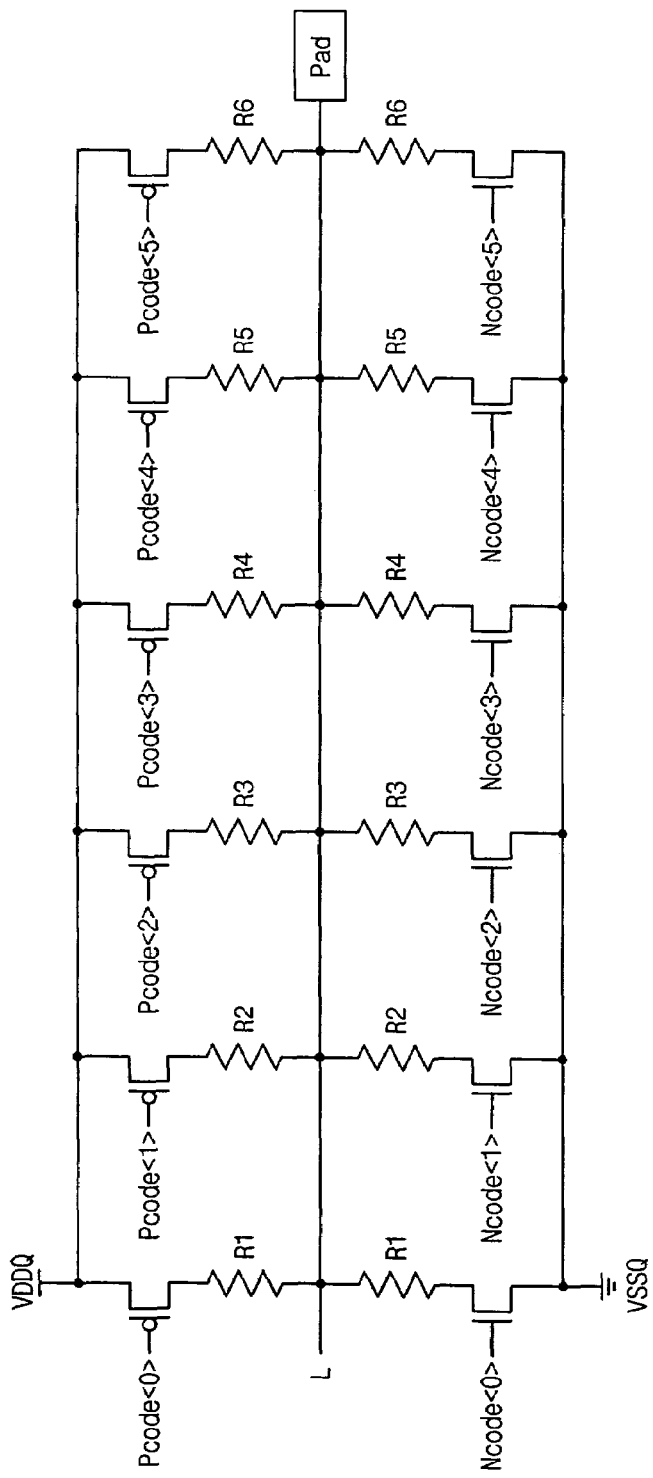
FIG. 3B is a circuit diagram showing an example of an input/output line, which receives an output signal of FIG. 3A to calibrate an impedance of the line.
Figure 4:
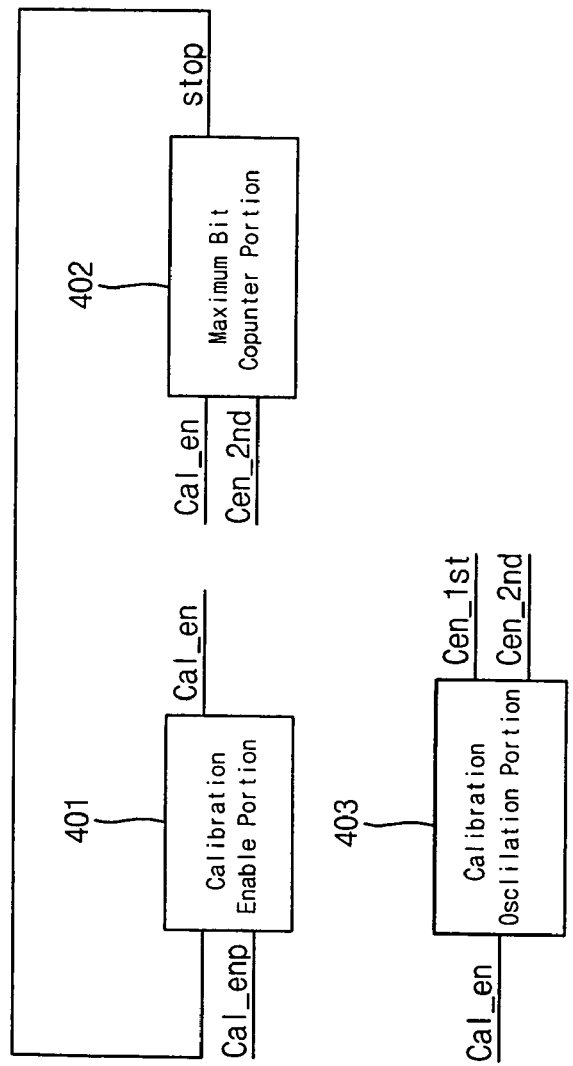
FIG. 4 is an example of the calibration control signal generating portion illustrated in FIG. 3A.
Figure 5:
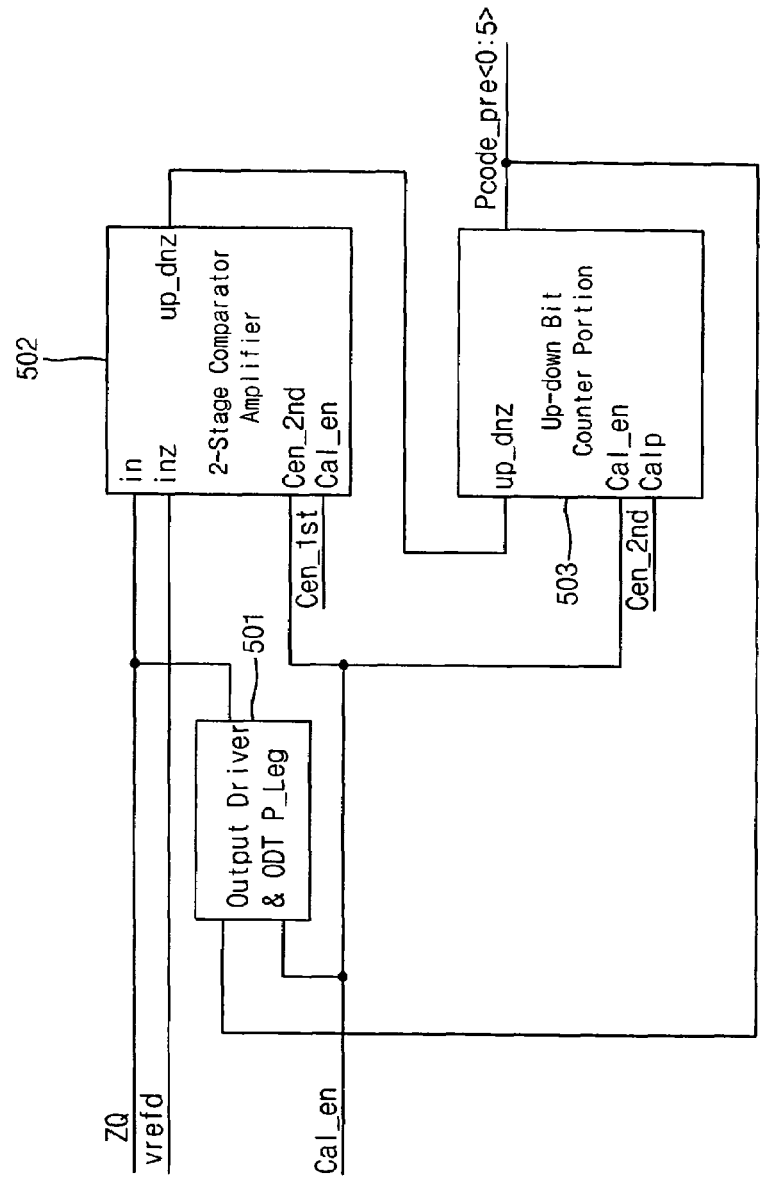
FIG. 5 is an example of the P-Leg calibration portion illustrated in FIG. 3A.
Figure 6:
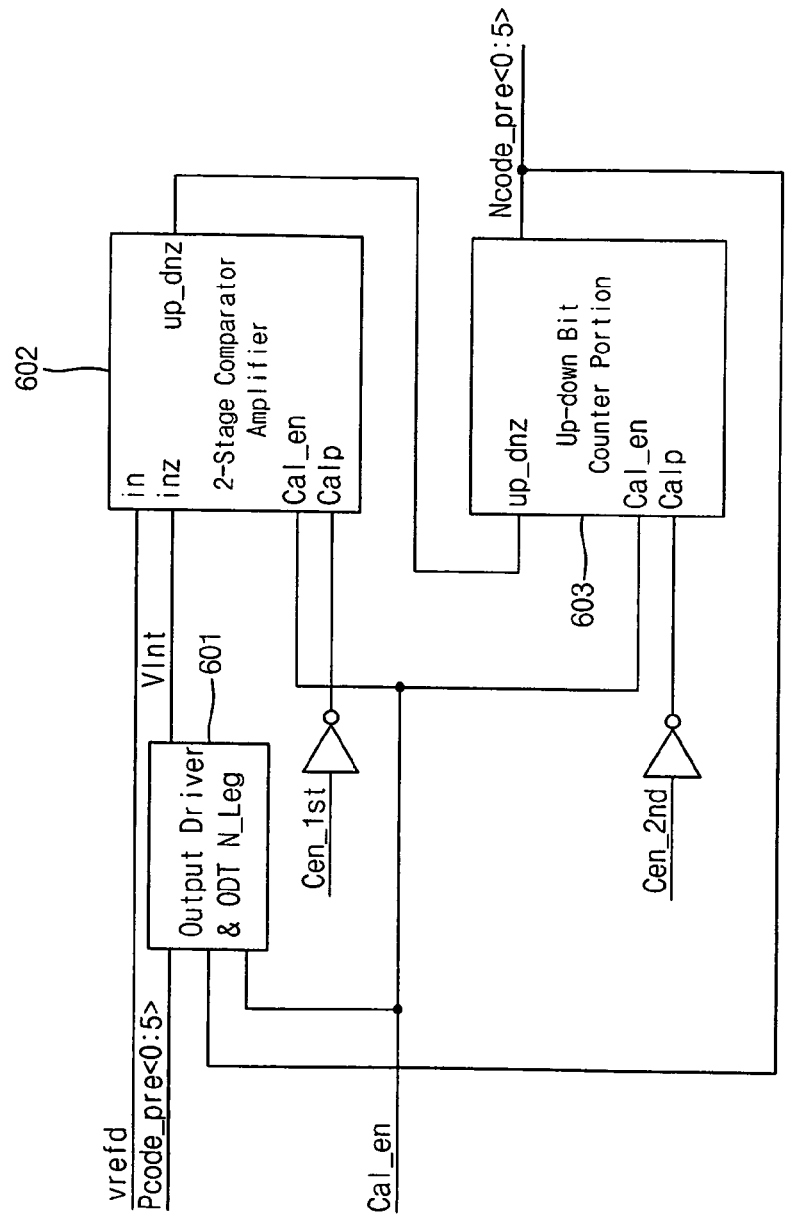
FIG. 6 is an example of the N-Leg calibration portion illustrated in FIG. 3A.
Figure 7:
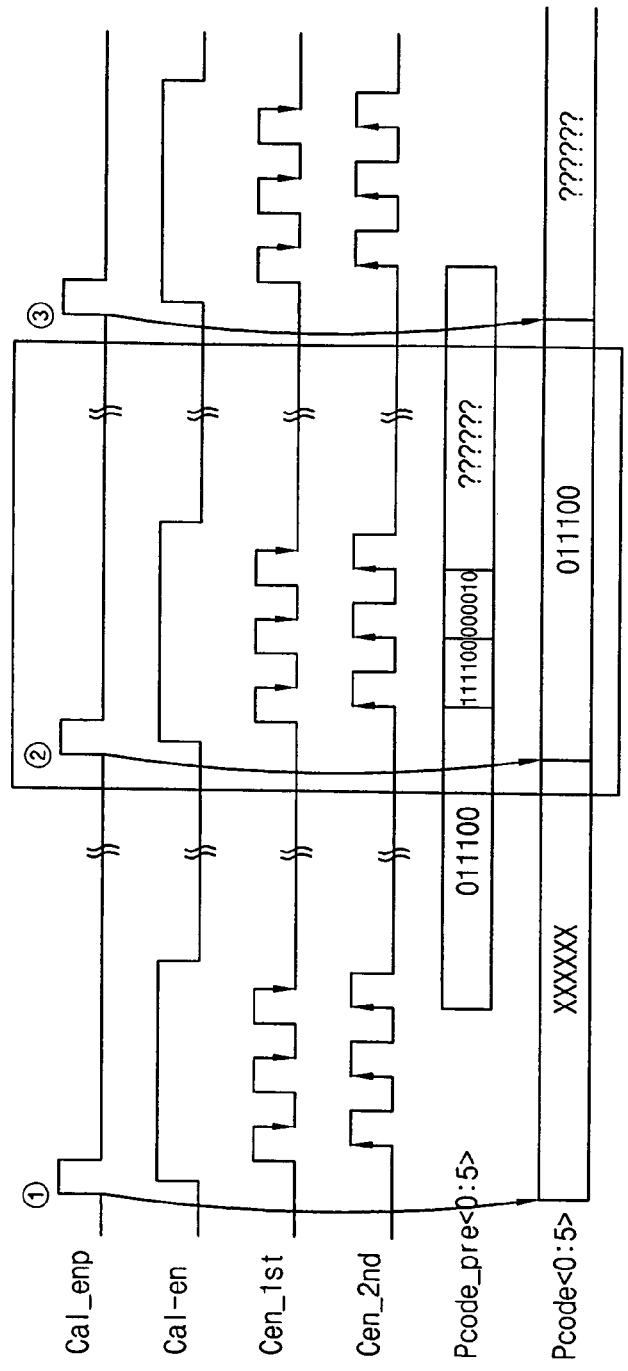
FIG. 7 is a waveform diagram for explaining an operation of a circuit illustrated in FIGS. 3A-3B and 4 through 6.
Figure 8:
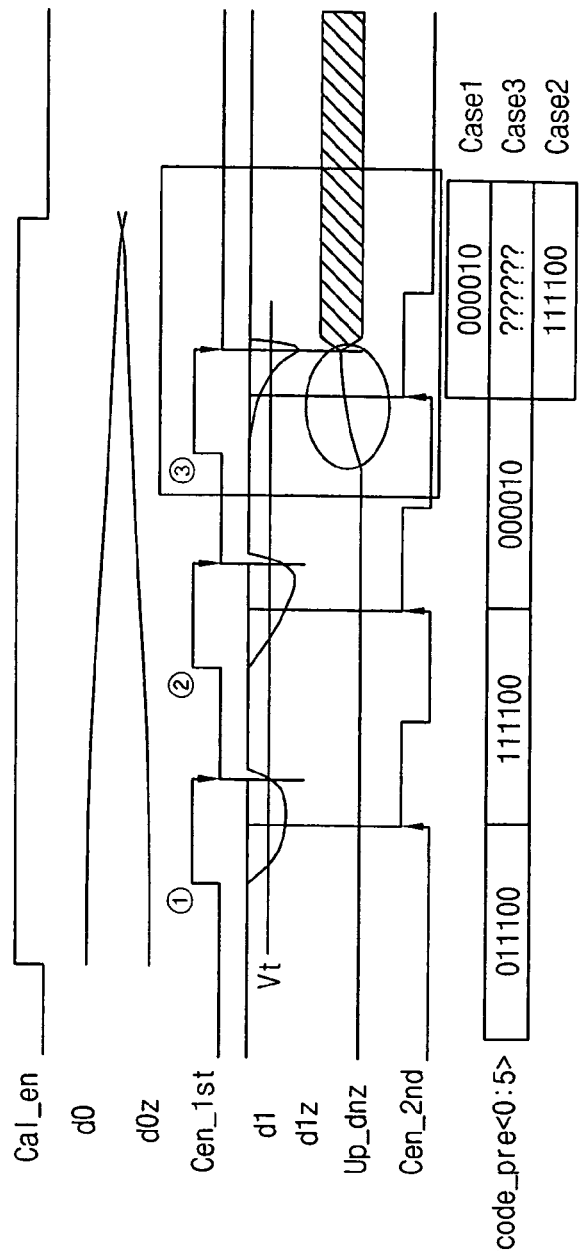
FIG. 8 is a waveform diagram for explaining waveforms of input signals of the 3-stage amplifier of FIG. 5 and its resulting output signal values of the up/down counter portion.

In the prior art, as illustrated in FIGS. 5 and 6, the enable signal Cen__2nd enters into an input signal calp of the up-down bit counter portion (503, 603). The up-down bit counter portion (503, 603), as shown in the point ③ of FIG. 8, has a configuration in which an unstable up_dnz level is applied as it is at a low level state of the enable signal Cen__2nd in the middle of the calibration time.

However, as illustrated in FIG. 14, the signal (up_dnz) of the present invention performs a calibration operation while the signal (CPcal) is low level, and a final value is latched at the moment when the signal (Cpal) transits from low level to high level. Then, if the signal (Cpal) is held for a predetermined time and the signal (up_dnz) is determined to high or low level, a stable level of the signal (up_dnz) determined at a falling edge of ③ is used as an input for the driver and ODT calibration.

The structure of the 2-stage comparator amplifier 1102 is shown in FIG. 15, and the circuit of FIG. 15 includes a comparator 1501 which compares the inputs (in, inz) by a current mirror type comparator circuit to output as phase-reversed signals (d0z, d0), a comparator 1503 which compares the signal (d0z, d0) by a latch type comparator circuit to output as phase-reversed signals (d1z, d1), and a latch 1505. An operation of the comparator 1501 is controlled by the enable signal (Cal_en), and an operation of the comparator 1503 and the latch 1505 is controlled by the signal (Calp). The signal (Calp) is a signal being synchronized with the signal (CPal).

Therefore, the signal (up_dnz) synchronized with a falling edge of the signal (CPcal) to be outputted is either high or low level. Therefore, as illustrated in the point ③ of FIG. 14, the signal (Pcode_pre<0:5>) is increased to "100010" or decreased to "111100" from "000010" even when the voltage difference between the first amplified signals (d0z, d0) is small. In other words, the present invention prevents any case of transitioning into the point ③ of FIG. 8, which as illustrated causes unexpected or incorrect value for the signal (Pcode_pre<0:5>) to be produced.

The method of calibrating a pull-down impedance of the output driver according to an embodiment of the present invention is same as the calibration of the output driver pull-up impedance and the ODT device impedance as described above. As a reference, a waveform diagram of the signals (CNcal_pre, Ncal_en, CNcal) of FIG. 14 is illustrated to show a timing of the signals being used when calibrating a pull-down impedance of the output driver.

Thus, according to the present invention, an increase/decrease of a control signal for impedance calibration can be controlled by one step in a stable state when calibrating the output driver impedance and ODT device impedance.

Furthermore, the present invention provides a minimum and maximum stop (Min & Max STOP) portion for reflecting the calibration based on the variation of temperature and voltage in the relevant region, such that an internal calibration can be stopped when the calibration impedance has the maximum or minimum value, and the calibration can be stopped at a best value when ZQ pins are respectively not connected but floated to test many devices at a time such as TDBI (test during burn-in). As a result, a receiver according to the present invention is configured to receive normal input without an ODT, thereby performing a normal test.

Though the present invention has been illustrated and described regarding a particular embodiment, the invention should not be so limited, and it will be appreciated that the invention may be altered or modified in various ways by those skilled in the art without departing from the spirit and scope of the invention as set forth in the appended claims.

What is claimed is:

1. An on-die termination (ODT) calibration method of a synchronous memory device comprising the steps of:
    generating a calibration enable signal for a calibration operation mode entry;
    generating code signals for calibrating an ODT for every predetermined interval of time;
    producing a first control signal generated based on the calibration enable signal; and
    latching a final code signal of the sequentially generated code signals by the first control signal to use as a driver and ODT impedance calibration signal.

2. The ODT calibration method of a synchronous memory device according to claim 1, wherein each of the code signals generated for calibrating an ODT for every predetermined interval of time is increased by one step or decreased by one step, and the one step indicates one bit.

3. An ODT calibration method of a synchronous memory device comprising the steps of:
    generating an calibration enable signal for starting a calibration operation;
    producing a first, a second, and a third calibration control signals in response to the calibration enable signal;
    outputting a first preliminary signal (Pcode_pre<0:5>) to calibrate a pull-up impedance of an output driver of the memory device in response to the first calibration control signal;
    outputting a second preliminary signal (Ncode_pre<0:5>) to calibrate a pull-down impedance of the output driver of the memory device in response to the second calibration control signal; and applying the first and the second preliminary signals to a pull-up and pull-down impedance calibration portion of the output driver in response to the third calibration control signal.

4. The ODT calibration method of a synchronous memory device according to claim 3, wherein the first preliminary signal (Pcode_pre<0:5>) is also applied to an ODT circuit of the memory device.

5. The ODT calibration method of a synchronous memory device according to claim 4, wherein the step of outputting a first preliminary signal (Pcode_pre<0:5>) to calibrate a pull-up impedance of an output driver of the memory device further includes a step of comparing a reference voltage with a node voltage of the ODT circuit.

6. The ODT calibration method of a synchronous memory device according to claim 4, wherein the step of outputting a second preliminary signal (Ncode_pre<0:5>) to calibrate a pull-down impedance of the output driver of the memory device further includes a step of comparing a reference voltage with the first preliminary signal.

* * * * *